United States Patent
Perisetty (10) Patent No.: US 7,782,581 B1
(45) Date of Patent: Aug. 24, 2010

(54) METHOD AND APPARATUS FOR PROVIDING ELECTROSTATIC DISCHARGE PROTECTION FOR A POLYSILICON FUSE

(75) Inventor: Srinivas Perisetty, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 117 days.

(21) Appl. No.: 11/903,956

(22) Filed: Sep. 25, 2007

(51) Int. Cl.
*H02H 3/22* (2006.01)

(52) U.S. Cl. .......................... 361/56; 361/111
(58) Field of Classification Search ............ 361/56, 361/111
See application file for complete search history.

(56) References Cited

U.S. PATENT DOCUMENTS

| 6,469,884 | B1* | 10/2002 | Carpenter et al. ........... 361/111 |
| 6,630,724 | B1* | 10/2003 | Marr ........................... 257/530 |
| 7,271,989 | B2* | 9/2007 | Huang et al. ................ 361/91.1 |
| 2008/0062605 | A1* | 3/2008 | Tsai et al. .................... 361/104 |
| 2008/0137251 | A1* | 6/2008 | Lin et al. .................... 361/91.1 |

\* cited by examiner

*Primary Examiner*—Danny Nguyen
(74) *Attorney, Agent, or Firm*—L. Cho (57) ABSTRACT

An electrostatic discharge (ESD) protection circuit for protecting a component on a device includes a grounding element coupled to a protected supply voltage line of the component. A supply pass element is coupled to the protected supply voltage line of the component. The ESD protection circuit also includes a control circuit to activate the grounding component to drive the protected supply voltage line of the component to ground upon detecting an ESD event.

26 Claims, 6 Drawing Sheets

METHOD AND APPARATUS FOR PROVIDING ELECTROSTATIC DISCHARGE PROTECTION FOR A POLYSILICON FUSE

TECHNICAL FIELD

Embodiments of the present invention relate to electrostatic discharge (ESD) protection devices. More specifically, embodiments of the present invention relate to a method and apparatus for providing ESD protection to a polysilicon fuse.

BACKGROUND

ESD is the transfer of electrostatic charge between two objects. It is a rapid event that usually results when two objects of different potentials come into contact with each other. ESD may also occur when a high electrostatic field develops between two objects in close proximity. ESD has been known to cause device failures in the semiconductor industry.

There are several industry-standard ESD models that define how semiconductor devices are tested for ESD sensitivity under different situations of electrostatic build-up and discharge. For example, the human body model (HBM) simulates the ESD phenomenon where a charged body directly transfers its accumulated electrostatic charge to an ESD-sensitive device. The machine module (MM) simulates a more rapid and severe electrostatic discharge from a charged machine, fixture, or tool to the ESD-sensitive device at a lower potential. The charged device model (CDM) simulates a transfer of accumulated electrostatic charge from a charged device to another body of lower potential.

In the past, ESD protection devices for polysilicon fuses utilized soft grounded PMOS structures connected in series with a power supply to the polysilicon fuse. These ESD protection devices relied on the programming time of the polysilicon fuse to protect inadvertent programming of the fuse. Since an ESD event occurs for only a short duration, the 100 micro seconds programming time requirement for 90 nm transistors was typically long enough to prevent the polysilicon fuse to be inadvertently programmed by the ESD event.

SUMMARY

According to an embodiment of the present invention, a method and apparatus for providing electrostatic discharge (ESD) protection is disclosed that is effective on a component on an ESD-sensitive device regardless of the programming time of the component. This is particularly useful for components such as transistors implemented with 65 nm technology which have a much shorter programming window. In one embodiment, an ESD protection circuit includes a grounding element coupled to a protected supply voltage line of the component. A supply pass element is coupled to the protected supply voltage line of the component. A control circuit activates the grounding component to drive the protected supply voltage line of the component to ground upon detecting an ESD event.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
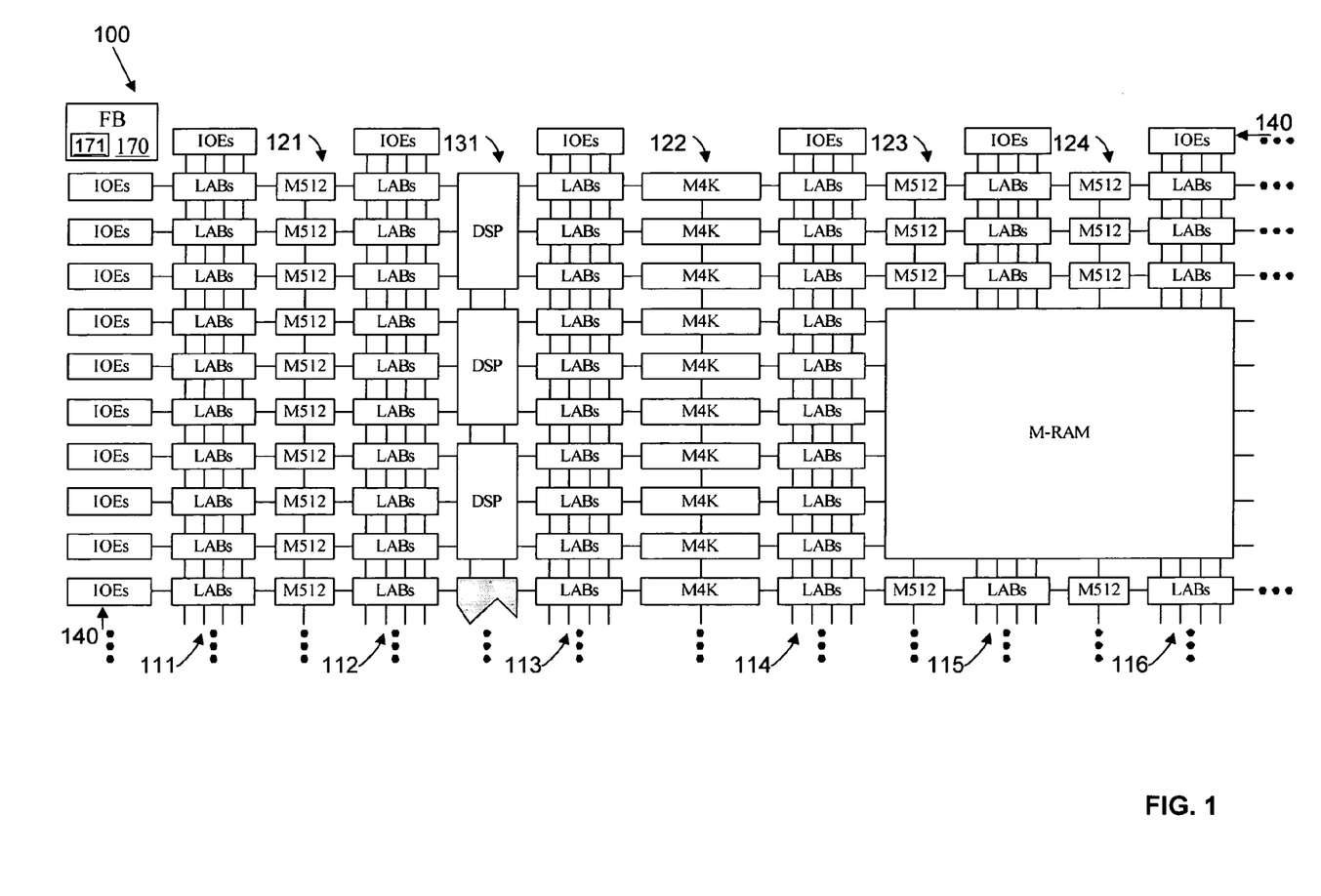
FIG. 1 illustrates a device on which an electrostatic discharge (ESD) protection circuit resides on according to an exemplary embodiment of the present invention.

FIG. 1 illustrates a device 100 on which an electrostatic discharge (ESD) protection circuit resides on according to an exemplary embodiment of the present invention. In this example, the device 100 is a target device such as an FPGA which a system may be implemented on. The target device 100 may be a chip having a hierarchical structure that may take advantage of wiring locality properties of circuits formed therein.

The target device 100 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ manufactured by Altera® Corporation. LABs are grouped into rows and columns across the target device 100. Columns of LABs are shown as 111-116. It should be appreciated that the logic block may include additional or alternate components.

The target device 100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100. Columns of memory blocks are shown as 121-124.

The target device 100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 100 and are shown as 131.

The target device 100 includes a plurality of input/output elements (IOEs) 140. Each IOE feeds an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. When used with dedicated clocks, the registers provide performance and interface support with external memory devices.

The target device 100 may include routing resources such as LAB local interconnect lines, row interconnect lines ("H-type wires"), and column interconnect lines ("V-type wires") (not shown) to route signals between components on the target device.

The target device 100 may provide for redundancy. For example, one or more redundant devices such as a LAB, memory block, and/or DSP block or redundant row/column of LABs, memory blocks, and/or DSP blocks may be activated and exchanged ("swapped") for existing device(s) or row/column of devices that may be defective. The existing device(s) or row/column of devices that is to be swapped out may be selected by programming a corresponding fuse in fuse box (FB) 170. The fuse box 170 includes an ESD protection circuit 171. The ESD protection circuit 171 operates to prevent fuses in the fuse box 170 from being inadvertently programmed in response to an ESD event.

FIG. 1 illustrates an exemplary embodiment of a target device. It should be appreciated that a system may include a plurality of target devices, such as that illustrated in FIG. 1, cascaded together. It should also be appreciated that the target device may include programmable logic devices arranged in a manner different than that on the target device 100. A target device may also include FPGA resources other than those described in reference to the target device 100. Thus, while the invention described herein may be utilized on the architecture described in FIG. 1, it should be appreciated that it may also be utilized on different architectures, such as those employed by Altera® Corporation in its APEX™, Stratix™, Cyclone™, Stratix™ II, Stratix™ III, Cyclone™ II, Cyclone™ III families of chips and those employed by Xilinx® Inc. in its Virtex™, Virtex™ II, Virtex™ II-PRO, Virtex IV™, Virtex V™, and Spartan-3 line of chips.

Figure 2:
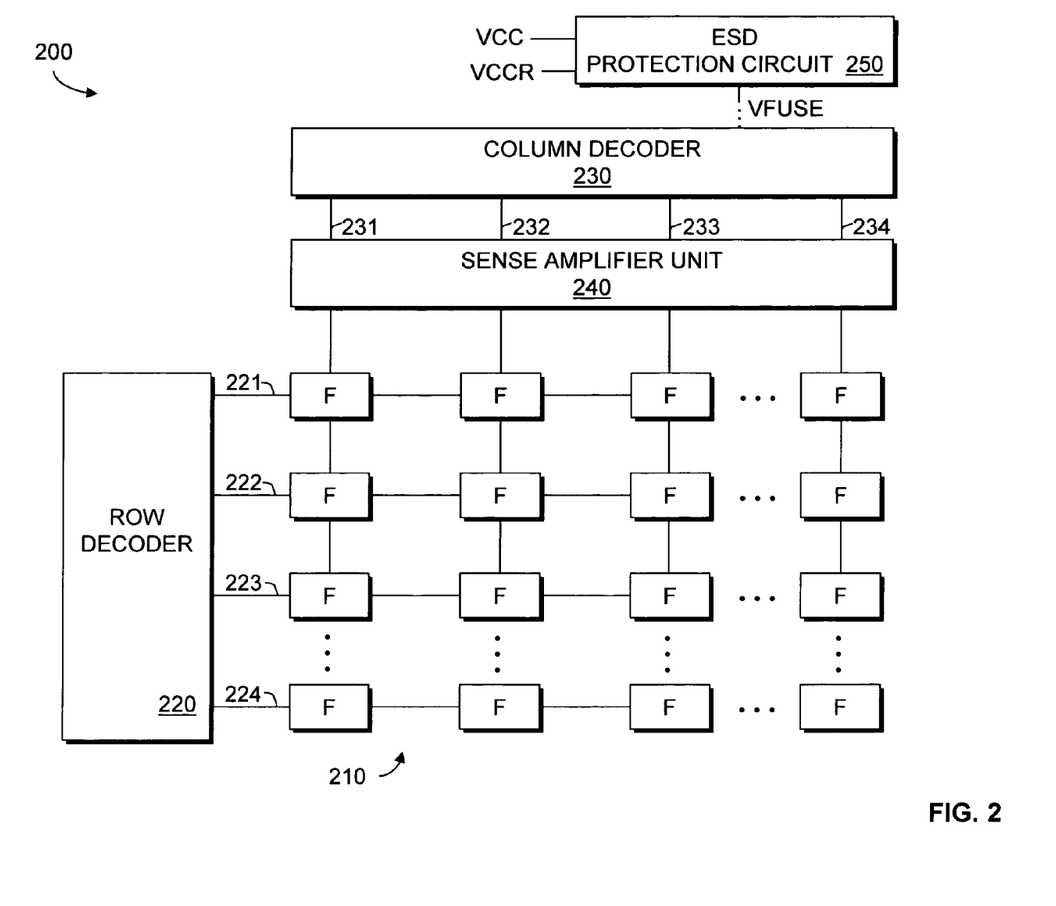
FIG. 2 illustrates a fuse box with an ESD protection circuit according to an exemplary embodiment of the present invention.

FIG. 2 illustrates a fuse box 200 according to an exemplary embodiment of the present invention. The fuse box 200 may be used to implement the fuse box 170 illustrated in FIG. 1. The fuse box 200 includes a plurality of fuses (F) 210. The fuses 210 may be arranged in an m×n array of m rows and n columns, where m and n may be any number. The fuses 200 may be non-volatile, polysilicon fuses. Each fuse may correspond to a one or more resources or row/column of resources on a target device. Programming a fuse may effectuate swapping out its corresponding one or more resources or row/column of resources with a redundant resource(s) or row/column of redundant resources.

The fuse box 200 includes a plurality of conductive row select lines 221-224 that extend in the x-direction across the array of fuses 210 and a plurality of conductive column select lines 231-234 extend in the y-direction across the array of fuses 210. The fuses 210 are located at the cross point of the row select lines and column select lines and may be programmed by having a row decoder 220 and column decoder 230 select appropriate row select and column select lines. The fuse box 200 includes a sense amplifier unit 240 coupled to the fuses 210 that may read the fuses 210 through column select lines 231-234.

The fuse box 200 includes an ESD protection circuit 250. The ESD protection circuit 250 may be used to implement the ESD protection circuit 171 illustrated in FIG. 1. The ESD protection circuit 250 has two supply inputs. The ESD protection circuit 250 is coupled to the supply voltage line for a device which it resides on (VCC), and a supply voltage line for the fuse box (VCCR). The ESD protection circuit 250 includes a protected supply voltage line for the fuse box (VFUSE) as its output. The ESD protection circuit 250 provides ESD protection on the protected supply voltage for the fuse box 200 when an ESD event occurs that results in a voltage spike on the supply voltage line for the fuse box 200.

Figure 3:
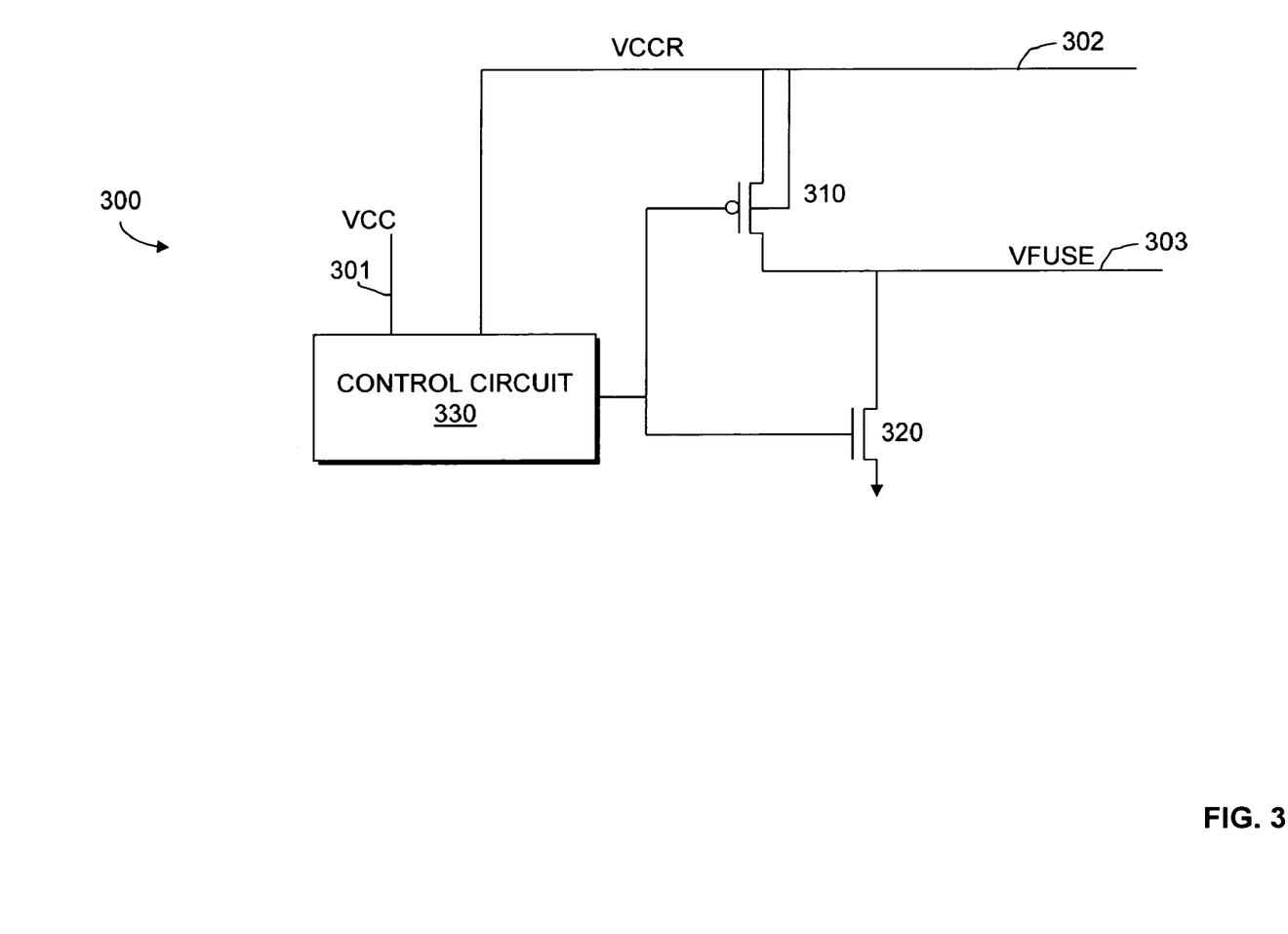
FIG. 3 illustrates an exemplary ESD protection circuit according to a first embodiment of the present invention.

FIG. 3 illustrates an exemplary ESD protection circuit 300 according to a first embodiment of the present invention. The ESD protection circuit 300 may be implemented as the ESD protection circuit 171 in FIG. 1 or 250 in FIG. 2. The ESD protection circuit 300 is connected to a supply voltage line for a device which it resides on 301 (VCC), a supply voltage line for the ESD-sensitive component 302 (VCCR), and a protected supply voltage line for the component 303 (VFUSE). The ESD protection circuit 300 includes a supply pass element 310 coupled to the supply voltage line for the component 302 and the protected supply voltage line of the component 303. The ESD protection circuit 300 includes a grounding element 320 coupled to the protected supply voltage line for the component 303 and ground. The ESD protection circuit 300 includes a control circuit 330 to activate the grounding element 320 to drive the protected supply voltage line of the component 303 to ground upon detecting an ESD event. The control circuit 330 also activates the supply pass element 310 to drive the protected supply voltage line for the component 303 to a voltage on the supply voltage line of the component 302 when the device is on and no electrostatic discharge event is detected.

According to an embodiment of the present invention, the supply pass element 310 may be implemented with a PMOS transistor and the grounding element 320 may be implemented with a NMOS transistor. In this embodiment, the source of the supply pass element 310 is coupled to the supply voltage line for the component 302 and the drain of the supply pass element 310 is coupled to the protected supply voltage line for the component 303. The drain of the grounding element 320 is coupled to the protected supply voltage line for the component 303 and the source of the grounding element 320 is connected to ground. The control circuit 330 is coupled to the gates of both the supply pass element 310 and the grounding element 320 and provides the gate control logic for the supply pass element 310 and the grounding element 320. Upon detection of an ESD event, the connection of the control circuit 330 coupled to the supply pass element 310 and the grounding element 320 is set to track VCCR. This causes the PMOS transistor (supply pass element 310) to turn off and the NMOS transistor (grounding element 320) to turn on. As a result VFUSE does not exceed a VT above ground. During normal operation, when no ESD event is detected and the device is on (VCC is present), the connection of the control circuit 330 coupled to the supply pass element 310 and the grounding element is set to 0 volts. This causes PMOS transistor (supply pass element 310) to turn on and NMOS transistor (grounding element 32) to turn off. As a result VFUSE tracks VCCR.

Figure 4:
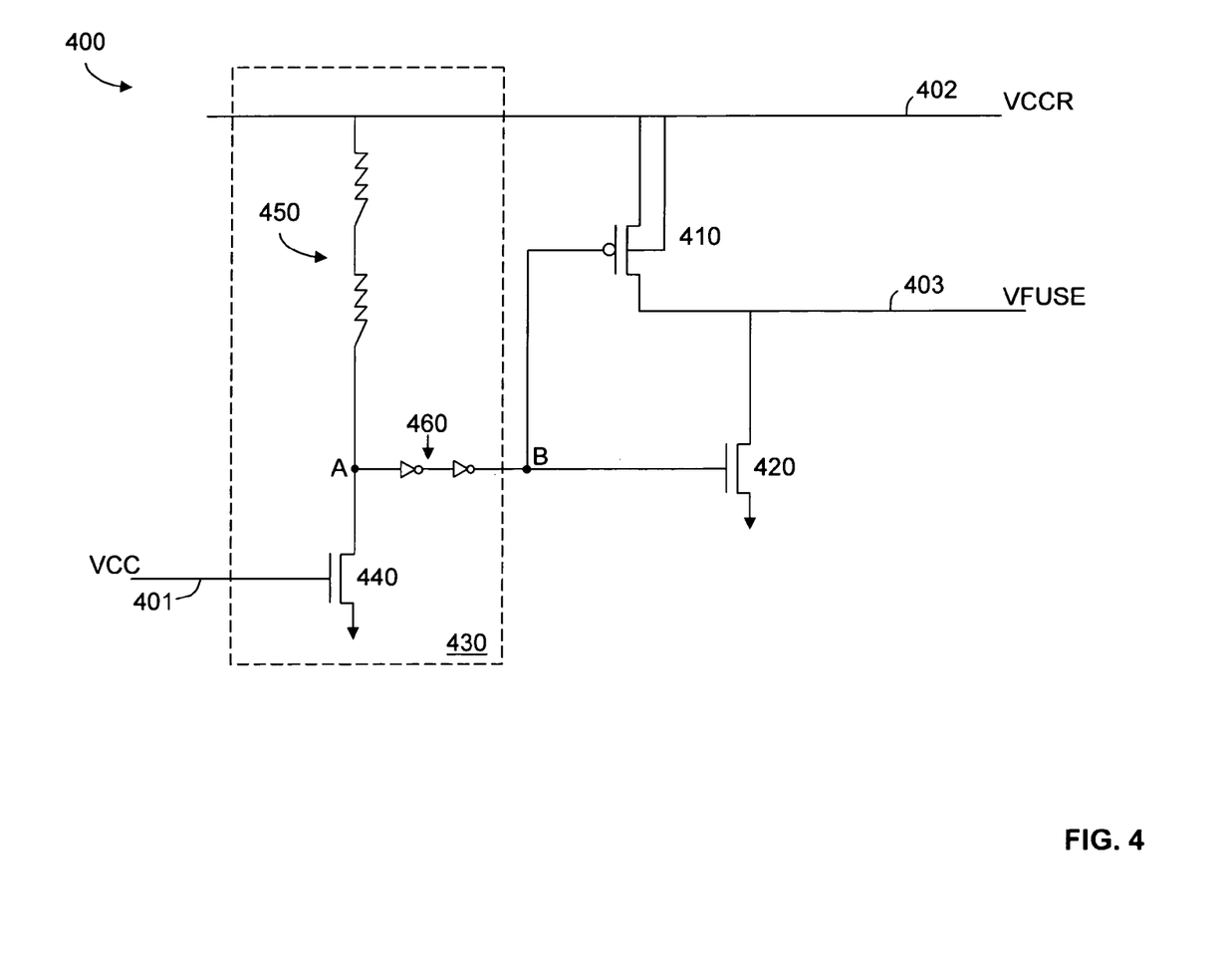
FIG. 4 illustrates an exemplary ESD protection circuit according to a second embodiment of the present invention.

FIG. 4 illustrates an exemplary ESD protection circuit 400 according to a second embodiment of the present invention. The ESD protection circuit 400 may be implemented as the ESD protection circuit 171 in FIG. 1 or 250 in FIG. 2. Similar to ESD protection circuit 300, ESD protection circuit 400 is connected to a supply voltage line for a device which it resides on 401 (VCC), a supply voltage line for the ESD-sensitive component 402 (VCCR), and a protected supply voltage line for the component 403 (VFUSE). The ESD protection circuit 400 includes a supply pass element 410 coupled to the supply voltage line for the component 402 and the protected supply voltage line of the component 403. The ESD protection circuit 400 includes a grounding element 420 coupled to the protected supply voltage line for the component 403 and ground. The ESD protection circuit 400 includes a control circuit 430 that operates similarly to the control circuit 330 shown in FIG. 3 and may be coupled to the supply pass element 410 and grounding element 420 similarly to how control circuit 330 is coupled to supply pass element 310 and grounding element 320 (shown in FIG. 3).

According to an embodiment of the present invention, the control circuit 430 includes a device supply element 440, a bleeder element 450, and a voltage maintenance element 460. The device supply element 440 is coupled to the supply voltage line 401 (VCC) and the bleeder element 450. When the device is on and the voltage on the supply voltage line 401 is at VCC, the device supply element 440 grounds the circuit at node A to 0 volts. Voltage maintenance element 460 maintains the voltage at node B to that of node A where the connection of the control circuit 430 is coupled to the supply pass element 410 and the grounding element 420. This allows activation of the supply pass element 410 and allows VFUSE to track VCCR. When the device is off and the voltage on the supply voltage line 401 is at 0 volts, the device supply element 440 is off and does not ground the circuit at node A to 0 volts. Upon the occurrence of an ESD event, a voltage originating from the ESD event at VCCR is driven to node A through the bleeder element 450. Voltage maintenance element 460 maintains the voltage at node B to that of node A. This deactivates the supply pass element 410 and activates the grounding element 420 which allows VFUSE to not exceed a VT above ground.

Figure 5:
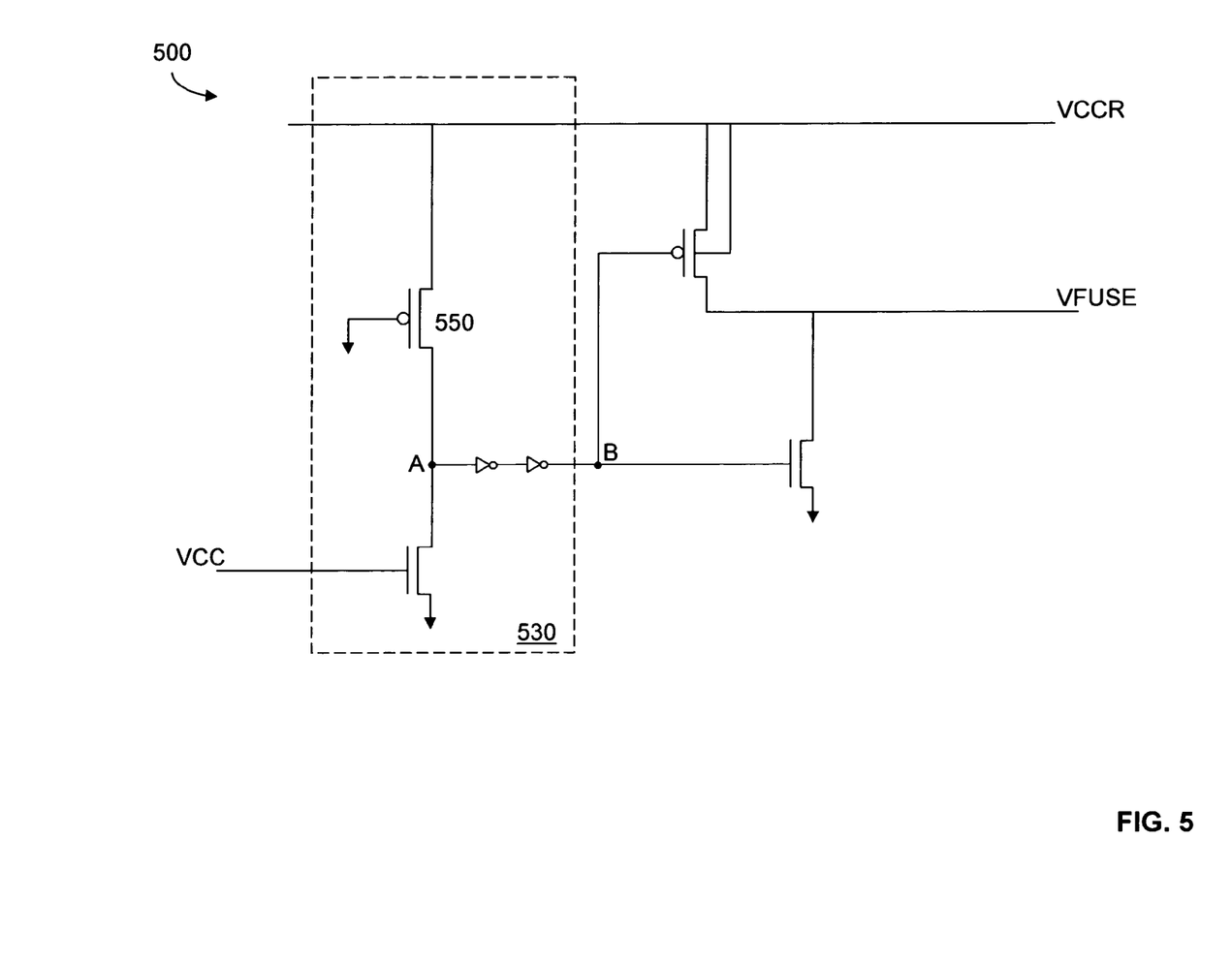
FIG. 5 illustrates an exemplary ESD protection circuit according to a third embodiment of the present invention.

In the illustrated embodiment of the control circuit 430 shown in FIG. 4, the device supply element 440 may be implemented by a NMOS transistor, the bleeder element 450 may be implemented by one or more resisters, and the voltage maintenance element 460 may be implemented using an even number of inverters in series. It should be appreciated that other components may also be used to implement the control circuit 440. For example, FIG. 5 illustrates an exemplary ESD protection circuit 500 according to an alternate embodiment of the present invention. The ESD protection circuit 500 operates similarly to the ESD protection circuit 400 shown in FIG. 4. The ESD protection circuit 500 includes a control circuit 530 that includes a bleeder element 550 that is implemented using a PMOS transistor instead of one or more resisters.

Figure 6:
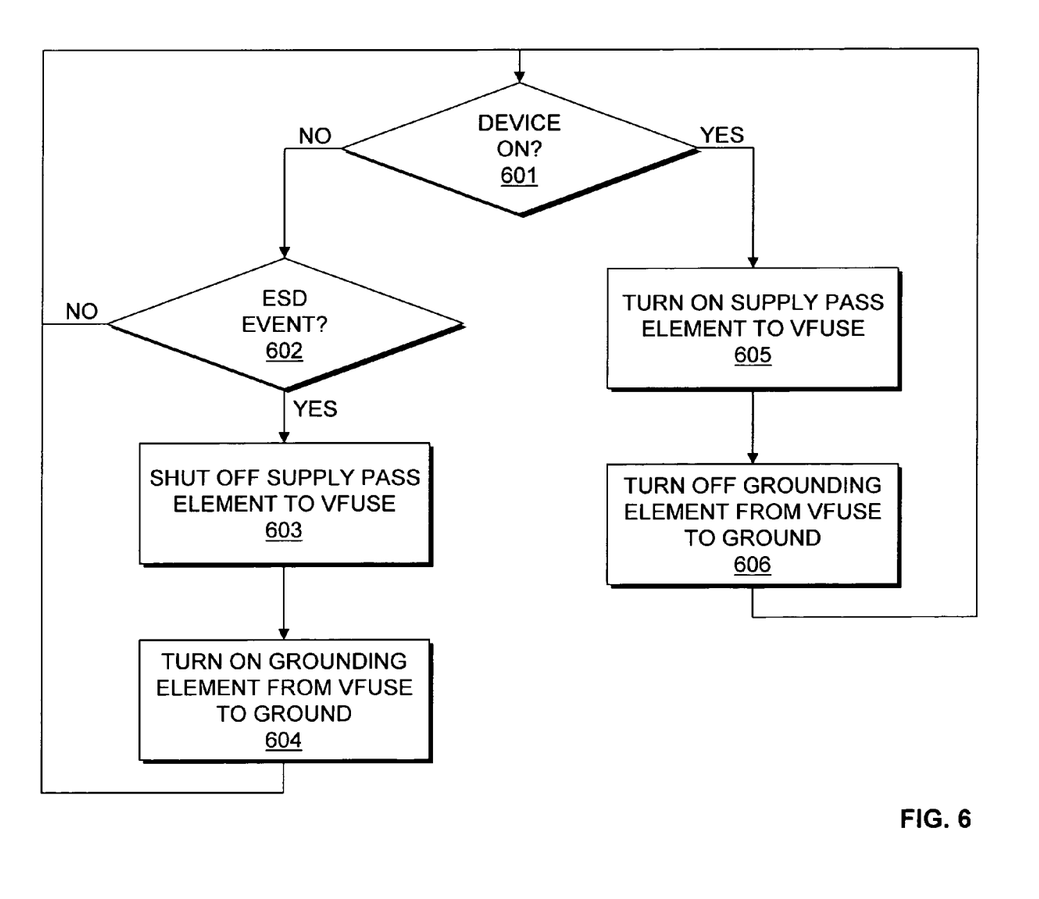
FIG. 6 is a flow chart illustrating a method for providing ESD protection according to an exemplary embodiment of the present invention.

FIG. 6 is a flow chart illustrating a method for providing ESD protection according to an exemplary embodiment of the present invention. The method may be used to provide ESD protection to a component residing on a device. At 601, it is determined whether the device is on. According to an embodiment of the present invention, the device is on when VCC is present. If it is determined that the device is on, control proceeds to 605. If it is determined that the device is not on, control proceeds to 602.

At 602, it is determined whether an ESD event has occurred. According to an embodiment of the present invention, an ESD event occurs when a supply voltage line of a device is at approximately 0 volts and a voltage is present on a supply voltage line for the component. If it is determined that an ESD event has occurred control proceeds to 603. If it is determined that an ESD event has not occurred, control proceeds to 601.

At 603, a supply pass element that couples a supply voltage line for the component to a protected supply voltage line for the component is shut off. According to an embodiment of the present invention, shutting off the supply pass element is achieved by transmitting the voltage originating from the ESD event to the supply pass element.

At 604, a grounding element that couples the protected supply voltage line for the component to ground is turned on. According to an embodiment of the present invention, turning on the grounding element is achieved by transmitting the voltage originating from the ESD event to the grounding element. According to an embodiment of the present invention, the procedures at 603 and 604 effectually drive the voltage level on the protected supply voltage line for the component to ground. Control returns to 601.

At 605, the supply pass element is turned on.

At 606, the grounding element is turned off. According to an embodiment of the present invention, the procedures at 605 and 606 effectually drive the voltage level on the protected supply voltage line for the component to the voltage on the supply voltage line for the component (VCCR). Control returns to 601.

FIG. 6 is a flow chart illustrating a method for providing ESD protection for a component on a device according to embodiments of the present invention. Some of the procedures illustrated in this figure may be performed sequentially, in parallel or in an order other than that which is described. The techniques may be also be performed one or more times. It should be appreciated that not all of the techniques described are required to be performed, that additional techniques may be added, that some of the illustrated techniques may be substituted with other techniques, and other specifics may be utilized to practice the procedures described.

Embodiments of the invention describe a method and apparatus for providing ESD protection for a component on a device that is independent of the programming time of the component. This is particularly useful for components that may be implemented with technologies that reduced their programming window. For example, transistors implemented with 65 nm technology may have a programming time as short as 5 micro seconds. For ESD events that involve an object of higher potential coming in contact with the device (HBM) that results in voltage being present on a supply voltage line for the component, a protected supply voltage line for the component is driven to ground by the ESD protection circuit. For ESD events that involve an object of lower potential coming in contact with the device (CDM) that results in voltage drops being created on the device, a ground path is created with a supply pass element and a grounding element of the ESD protection device.

Embodiments of the ESD protection circuit has been shown and described to work with protecting a component such as a polysilicon fuse residing in a device such as an FPGA. It should be appreciated that the ESD protection circuit may be used to protect other types of components residing on other types of devices from ESD events.

In the foregoing specification embodiments of the invention has been described with reference to specific exemplary embodiments thereof. It will, however, be evident that various modifications and changes may be made thereto without departing from the broader spirit and scope of the embodi-

What is claimed is:

1. An electrostatic discharge (ESD) protection circuit for protecting a component on a device, comprising:
   a grounding element coupled to a protected supply voltage line which is directly coupled to the component;
   a supply pass element coupled to a supply voltage line to power the protected supply voltage line; and
   a control circuit to activate the grounding element to drive the protected supply voltage line of the component to ground upon detecting an ESD event.

2. The apparatus of claim 1, wherein the supply voltage line of the device is at 0 volts during the electrostatic discharge event.

3. The apparatus of claim 1, wherein the electrostatic discharge event involves an object of higher potential than the device transferring a charge to the device.

4. The apparatus of claim 1, wherein the electrostatic discharge event involves an object of lower potential than the device causing the device to transfer a charge out of the device via a grounding path.

5. The apparatus of claim 1, wherein the control circuit activates the supply pass element to drive the protected supply voltage line of the component to a voltage on a supply voltage line of the component when the device is on and no electrostatic discharge event is detected.

6. The apparatus of claim 1, wherein the grounding element is a NMOS transistor.

7. The apparatus of claim 1, wherein the supply pass element is a PMOS transistor.

8. The apparatus of claim 1, wherein the control circuit comprises:
   a bleeder element directly coupled to the supply voltage line; and
   a device supply element coupled to the bleeder element.

9. The apparatus of claim 8, wherein the device supply element is a NMOS transistor.

10. The apparatus of claim 8, wherein the bleeder element comprises one or more resistors.

11. The apparatus of claim 8, wherein the bleeder element comprises a PMOS transistor.

12. The apparatus of claim 1, wherein the device is a field programmable gate array.

13. The apparatus of claim 1, wherein the component is a polysilicon fuse.

14. The apparatus of claim 1, wherein the ESD protection circuit operates independently of a programming time of the component.

15. An electronic device, comprising:
   a polysilicon fuse for selecting one or more redundant resources to replace one or more resources; and
   a electrostatic discharge (ESD) protection circuit to prevent programming of the polysilicon fuse during an ESD event, wherein the ESD protection circuit operates independently of a programming time for the fuse.

16. The apparatus of claim 15, wherein the electronic device is a field programmable gate array.

17. The apparatus of claim 15, wherein the ESD protection circuit comprises:
   a grounding element coupled to a supply voltage line which is directly coupled to the fuse;
   a supply pass element coupled to the supply voltage line for the fuse; and
   a control circuit to activate the grounding element to drive the supply voltage line for the fuse to ground upon detecting the ESD event.

18. The apparatus of claim 17, wherein the control circuit activates the supply pass element to drive the protected supply voltage line for the component to a voltage on a supply voltage line for the component when the device is on and no electrostatic discharge event is detected.

19. The apparatus of claim 17, wherein the grounding element is a NMOS transistor and the supply pass element is a PMOS transistor.

20. The apparatus of claim 17, wherein the control circuit comprises:
   a bleeder element directly coupled to a supply voltage line; and
   a device supply element coupled to the bleeder element.

21. The apparatus of claim 20, wherein the device supply element is a NMOS transistor.

22. An electrostatic discharge (ESD) protection circuit for protecting a component on a device, comprising:
   a grounding element coupled to a protected supply voltage line which is directly coupled to the component;
   a supply pass element coupled to a supply voltage line and the protected supply voltage line; and
   a control circuit, coupled to the supply voltage line, to activate the grounding element to drive the protected supply voltage line of the component to ground and to shut off the supply pass element during an entire ESD event upon detecting the ESD event on the supply voltage line.

23. The ESD protection circuit of claim 22, wherein the ESD protection circuit operates independently of a programming time of the component.

24. The ESD protection circuit of claim 22, wherein the control circuit comprises:
   a bleeder element directly coupled to the supply voltage line; and
   a device supply element coupled to the bleeder element.

25. The ESD protection circuit of claim 22, wherein the control circuit activates the supply pass element to drive the protected supply voltage line to a voltage on the supply voltage line when the device is on and no electrostatic discharge event is detected.

26. The ESD protection circuit of claim 22, wherein the supply voltage line of the device is at 0 volts during the electrostatic discharge event.

* * * * *